United States Patent
Wilson et al.

(10) Patent No.: US 7,498,960 B2
(45) Date of Patent: Mar. 3, 2009

(54) PROGRAMMABLE COMPUTE SYSTEM FOR EXECUTING AN H.264 BINARY DECODE SYMBOL INSTRUCTION

(75) Inventors: James Wilson, Foxboro, MA (US); Joshua A. Kablotsky, Carlisle, MA (US); Yosef Stein, Sharon, MA (US); Christopher M. Mayer, Dover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/788,094

(22) Filed: Apr. 19, 2007

(65) Prior Publication Data

US 2008/0258947 A1    Oct. 23, 2008

(51) Int. Cl.
   *H03M 7/00* (2006.01)
(52) U.S. Cl. .......................... 341/106; 341/50
(58) Field of Classification Search ............ 341/50, 341/51, 107, 106
   See application file for complete search history.

(56) References Cited

U.S. PATENT DOCUMENTS

| | | | | |
|---|---|---|---|---|
| 5,404,140 A | * | 4/1995 | Ono et al. | 341/107 |
| 6,876,317 B2 | * | 4/2005 | Sankaran | 341/107 |
| 6,952,764 B2 | | 10/2005 | Sager et al. | |
| 7,054,493 B2 | * | 5/2006 | Schwartz | 382/232 |
| 7,183,951 B2 | * | 2/2007 | Bossen | 341/107 |
| 2005/0010623 A1 | | 1/2005 | Ku | |
| 2008/0075376 A1 | | 3/2008 | Wilson et al. | |

OTHER PUBLICATIONS

U.S. Appl. No. 11/527,001, filed Sep. 26, 2006, Wilson et al.
U.S. Appl. No. 11/788,095, Stein et al.

* cited by examiner

*Primary Examiner*—Peguy JeanPierre
(74) *Attorney, Agent, or Firm*—Iandiorio Teska & Coleman (57) ABSTRACT

A compute system for executing an h.264 binary decode symbol instruction including a first compute unit having a range normalization circuit and an rLPS update circuit, and operating in a first mode responsive to current rLPS, range, value and current context to generate the next normalized range and next rLPS for the current context; a second compute unit including a value update circuit, a context update circuit, and value normalization circuit responsive to current rLPS, range value and current context to obtain the output bit, normalized value and the updated current context; and a third compute unit or said first compute unit operating in a second mode including a range circuit and a next context rLPS circuit responsive to rLPS range, value and next context to obtain a next context rLPS value.

12 Claims, 10 Drawing Sheets

PROGRAMMABLE COMPUTE SYSTEM FOR EXECUTING AN H.264 BINARY DECODE SYMBOL INSTRUCTION

FIELD OF THE INVENTION

A programmable compute system for executing an h.264 binary decode symbol instruction.

BACKGROUND OF THE INVENTION

Arithmetic coding processes such as PEG2000, JPEG, On2, Or H.264 often use Context-based Adaptive Binary Arithmetic Coding (CABAC). The original principle of binary arithmetic coding is based on recursive subdivision of the interval width Range. [For a full description of the H264 CABAC standards and details see ITU-T Series H: Audiovisual and Multimedia Systems Infrastructure of audiovisual-coding of moving video]. Given the estimation of probability $p_{LPS}$ of Least Probable Symbol (LPS), the interval is subdivided into two subintervals: one interval width rLPS=Range·$p_{LPS}$ which is associated with the LPS, and the other interval width rMPS=Range−rLPS, which is assigned to the Most Probable Symbol (MPS). Depending on whether the observed bit to be encoded is MPS or LPS, the corresponding subinterval is chosen as the new interval. The binary arithmetic coding process keeps updating the interval width register Range which marks the range of the interval and the code register Value which marks the lower bound of the interval. According to H.264 CABAC process, the Range·$p_{LPS\ required}$ to perform the interval subdivision is approximated using a 4×64 2-D pre-stored table. Range value is approximated by four quantized values (2-bits) using an equal-partition of the whole range $2^8 \leq Range \leq 2^9$ and the value of $p_{LPS}$ is approximated by 64 quantized values indexed by a 6-bit MPS or LPS state. If the code offset (Value) is less than the current Range, the MPS path is taken where the most probable path range is determined from the previous Range and the approximated Range·$p_{LPS}$. The most probable symbol (MPS) is designated as the next output bit, and the state transition is preformed based on the most probable symbol (MPS) look-up table. If Value is greater than current range, the LPS path is taken where the MPS bit is inverted, the current Value is determined from the previous Value and the MPS range, then range becomes rLPS. If the current LPS state equals zero, the MPS is inverted, and the state transition is preformed based on the least probable symbol (LPS) look-up table, followed by the renormalization process where the range and value are renormalized. Range is renormalized to the [511,256] interval by left-shifting range the required amount of bits and the Value is scaled up accordingly and the lower bits are appended from the incoming bit stream. Also see U.S. patent application Ser. No. 11/527,001, filed Sep. 26, 2006, entitled "Iterative Process with Rotated Architecture for Reduced Pipeline Dependency" (AD-473) and co-pending U.S. patent application Ser. No. 11/788,095 filed on Apr. 19, 2007, entitled "Simplified Programmable Compute System For Executing an H.264 Binary Decode Symbol Instruction" (AD-506J), each of which are incorporated by reference herein.

BRIEF SUMMARY OF THE INVENTION

It is therefore an object of this invention to provide a programmable compute system for executing an H.264 binary decode symbol instruction.

It is a further object of this invention to provide such a programmable compute system for executing an H.264 binary decode symbol instruction which increases system flexibility and efficiency and enables "soft" solutions, i.e., without dedicated hardware.

It is a further object of this invention to provide such a programmable compute system for executing an h.264 binary decode symbol instruction which saves area and power.

It is a further object of this invention to provide such a programmable compute system for executing an H.264 binary decode symbol instruction which uses the compute unit lookup table for storing the rLPS, MPS and LPS state tables.

It is a further object of this invention to provide such a programmable compute system for executing an H.264 binary decode symbol instruction which uses the compute unit lookup table for implementing the arithmetic coding bit stream FIFO.

It is a further object of this invention to provide such a programmable compute system for executing an H.264 binary decode symbol instruction which implements a rotated H.264 arithmetic coding algorithm to best fit the compute unit hardware dependencies.

It is further object of this invention to provide such an H.264 decoding arithmetic coding symbol instruction which re-uses existing compute units.

The invention results from the realization that a programmable compute system for executing an H.264 binary decode symbol instruction can be achieved using a first compute unit including a range normalization circuit and a rLPS update circuit, and operating in a first mode responsive to current rLPS, Range Value and current context to generate the next normalized range and next rLPS for the current context; a second compute unit including a value update circuit, a context update circuit and value normalization circuit responsive to current rLPS, Range Value and current context to obtain the output bit, normalized value and the updated currant context; and either a third compute unit or the first compute unit operating in a second mode configured to implement a range circuit and a next context rLPS circuit responsive to rLPS, range, value and next context to obtain a next context rLPS value.

The subject invention, however, in other embodiments, need not achieve all these objectives and the claims hereof should not be limited to structures or methods capable of achieving these objectives.

This invention features a programmable compute system for executing an h.264 binary decode symbol instruction including a first compute unit including a first range circuit responsive to the current rLPS current range and current value for calculating MPS and LPS range values and setting a first flag to select one of them. A range normalization circuit, responsive to the selected one of the MPS and LPS range values provides normalized range. A current rLPS circuit including a first look up table is responsive to the state, the flag and the normalized range for generating the current context next rLPS. A second compute unit including a second range circuit is responsive to the current rLPS range and value for calculating MPS and LPS range values and setting a second flag to select one of them. A value update circuit is responsive to the current value and the difference between the current range and current rLPS for calculating MPS and LPS value values and is responsive to the second flag to select one of them. A value normalization circuit is responsive to the selected range value and the selected value value to provide the next value. And a current context update circuit is responsive to current context MPS and state for determining MPS and LPS state from a second look up table and selecting one of them in response to the second flag and generating an MPS and negated MPS bit and providing the next context MPS and state and the decode symbol. A third compute unit including a third range circuit is responsive to current rLPS, range and value for calculating MPS and LPS range values and setting a third flag to select one of them. A second range normalization circuit is responsive to the selected one of the MPS and LPS range values to provide normalized range. A next new context rLPS circuit, responsive to the new context state and the normalized range determines from a third look up table the next rLPS for the new context.

In a preferred embodiment the first, second and third flags generated in each of first, second and third compute units may be identical. The range circuit may include a subtraction circuit for generating the MPS range from the range and rLPS, a decision circuit for comparing the MPS range and value, and setting the first flag as a function thereof and a selector circuit responsive to the first flag for selecting the MPS range or the LPS range. Each range normalization circuit may include a detection circuit for detecting leading zeros in the selected MPS/LPS range value and a shift circuit responsive to leading zeros detected by the detection circuit for shifting up the range to generate a normalized range value. The first look up table may respond to the current normalized range and state and the first flag to provide the rLPS values for the next state. The first look up table may include an MPS and an LPS table and the first flag determines which table will be addressed. The value normalization circuit may include a leading zero detection circuit responsive to the selected range value, a shift circuit responsive to the number of leading zeros from the leading zero detection circuit and the selected value value for providing the shifted value value and a bit FIFO for appending the number of leading zeros to the shifted value value to generate the next value. The second look up table may include a state table and a bit FIFO table. The third look up table may include a new context rLPS table This invention also features a programmable compute system for executing an h.264 binary decode symbol instruction including a first compute unit including a first range circuit responsive to the current rLPS current range and current value for calculating MPS and LPS range values and setting a first flag to select one of them. A range normalization circuit is responsive to the selected one of the MPS and LPS range values to provide normalized range. A current rLPS circuit including a first look up table is responsive to the state, the flag and the normalized range for generating the current context next rLPS. A second compute unit may include a second range circuit responsive to the current rLPS range and value for calculating MPS and LPS range values and setting a second flag to select one of them. A value update circuit is responsive to the current value and the difference between the current range and current rLPS for calculating MPS and LPS value values and responsive to the second flag to select one of them. A value normalization circuit, responsive to the selected range value and the selected value value provides the next value. A current context update circuit is responsive to current context MPS and state, for determining MPS and LPS state from a second look up table and selecting one of them in response to the second flag and generating an MPS and negated MPS bit and providing the next context MPS and state and the decode symbol.

In a preferred embodiment in a second mode the first compute unit may include a new context rLPS table in the first look up table and is responsive to the current rLPS, range and value and new context for generating the next rLPS for the new context.

This invention also features a programmable compute system for executing an h.264 binary decode symbol instruction including a first compute unit including a range normalization circuit and an rLPS update circuit, and operating in a first mode responsive to current rLPS, range, value and current context to generate the next normalized range and next rLPS for the current context. A second compute unit including a value update circuit, a context update circuit, and value normalization circuit is responsive to current rLPS, range value and current context to obtain the output bit, normalized value and the updated current context. A third compute unit or the first compute unit operating in a second mode including a range circuit and a next context rLPS circuit is responsive to rLPS range, value and next context to obtain a next context rLPS value.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
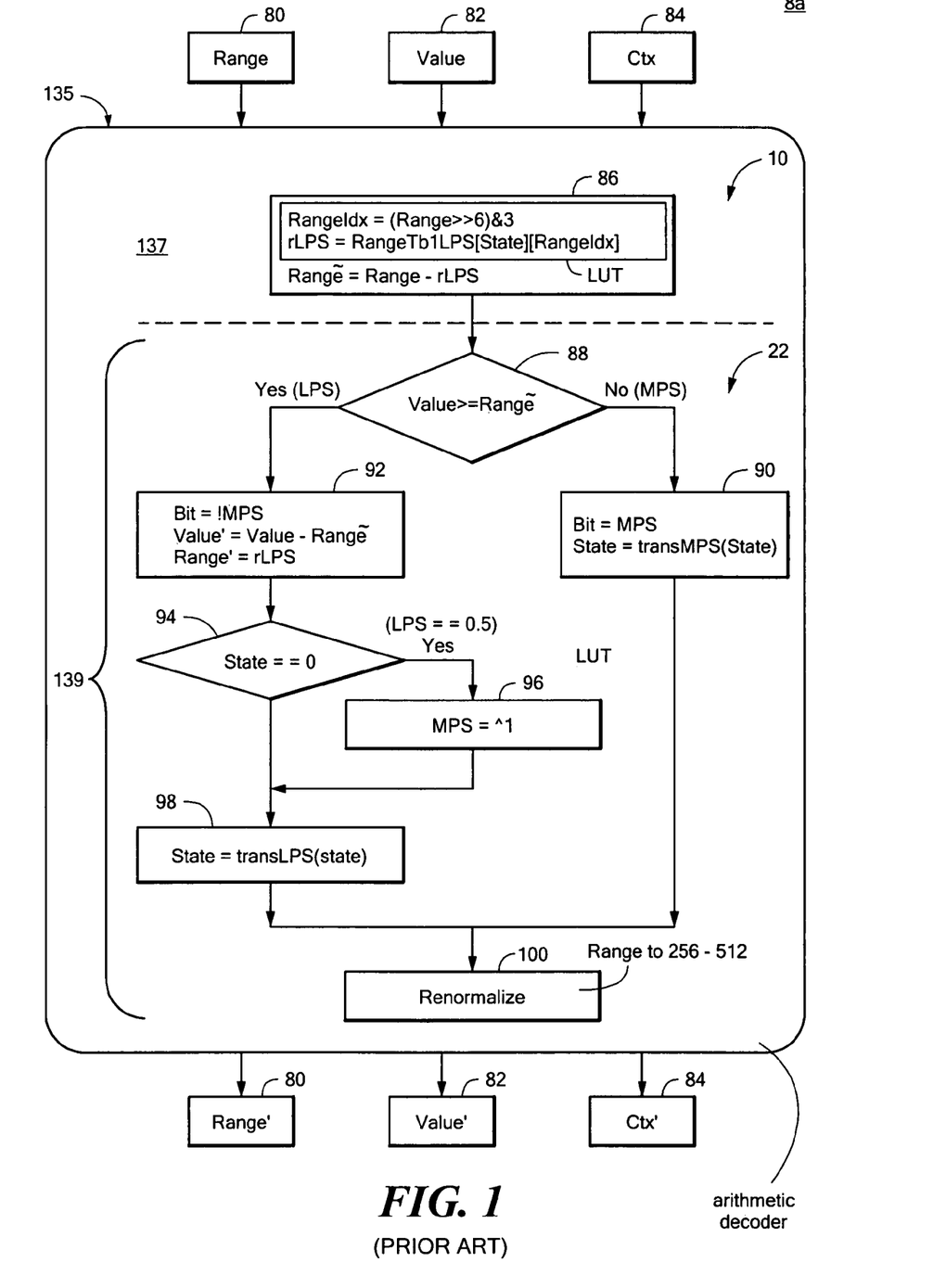
FIG. 1 is a flow block diagram of a prior art method of H.264 CABAC decoding.

In a H.264 CABAC process 8a, FIG. 1, there are three inputs, present range 80, value 82, and context 84. In the first step 86, rLPS=Range·$p_{LPS}$ and intermediate range~ are calculated. rLPS is typically generated using a 4×64 2D look-up table. In step 88 it is determined as to whether value is greater than the intermediate range~. If it is not greater than the intermediate range~, the Most probable symbol path is taken where in step 90 MPS is assigned as the output bit and the state of the context is updated using a second look-up table (the MPS-transition table). If the value is greater that the range the Least probable symbol path is taken where in step 92 an inverted MPS is assigned as the output bit, the next value is calculated from the value and the intermediate range~ and the next range is determined from the rLPS. Following this in step 94, if the state is equal to zero the MPS is negated in step 96. If state is not equal to zero following step 94, or following step 96, a new state is determined 98 from a third look-up table (the LPS-transition table). Finally, whether the value is greater than or less than the range, the respective outputs are renormalized 100 to a range between 256 and 512, the Value is scaled up accordingly and the new LSB bits of Value are appended from the bit stream FIFO. The outputs resulting then are the normalized next range, range', normalized next value, value', and next context, context'. The operation of process 8a is effected by arithmetic decoder 135.

Figure 4:
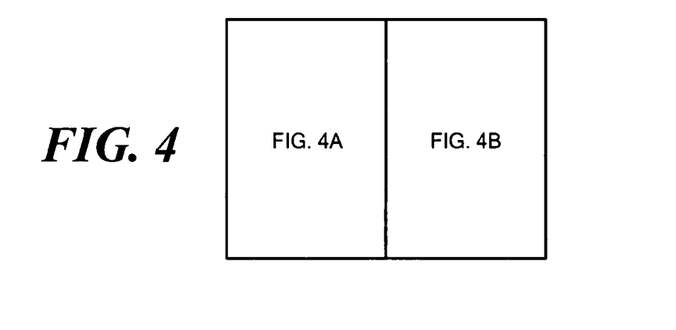
FIG. 4 is a directory of FIGS. 4A and 4B which are schematic block diagram of an arithmetic processor with four compute units for implementing this invention.

In contrast CABAC decoder processor 30a in accordance with the inventions of U.S. patent application Ser. No. 11/527,001, filed Sep. 26, 2006, entitled "Iterative Process with Rotated Architecture for Reduced Pipeline Dependency" (AD-473), and U.S. patent application Ser. No. 11/788,095 filed Apr. 19, 2007, entitled "Simplified Programmable Compute System For Executing an H.264 Binary Decode Symbol Instruction" (AD-506J), each of which are incorporated by reference herein, FIG. 2, has four inputs, present range, 102, present rLPS 104, present value 106, and present context 108. In the process 30a according to this invention the present rLPS 104 is supplied externally. With the rLPS being supplied the dependency of range~ on the two dimensional state/range look-up table of rLPS result is resolved, and the intermediate range~ is determined from the present range and the present rLPS in step 110. Then in step 112 it is determined whether the value is greater than the intermediate range, if it is not, once again the Most probable symbol path is taken where in step 114 the MPS is assigned to a bit and the state of the context is updated by reference to a first MPS-transition look-up table. If the value is greater than the intermediate range then the Least probable symbol path is taken where MPS has assigned to it the inverted bit, next value' is determined from present value and intermediate range~and the next range' is determined from the rLPS. In step 118 inquiry is made as to whether the state is equal to zero. If it is the MPS is negated in step 120. In step 122 the new context state is determined from a second LPS-transition look-up table. In either case in step 124 the system is renormalized as previously explained. Then in 126 the first two operations in step 86 of the prior art device, FIG. 4, are now performed. There in step 126 the next rLPS, rLPS' is determined from the normalized next range' and the updated context next state' using a third 2D look-up table. The output then is the next range, range' 128 the next rLPS, rLPS' 130, the next value, value' 132, and the next context, context' 134. The operation of process 30a is effected by arithmetic decoder 135a.

Figure 2:
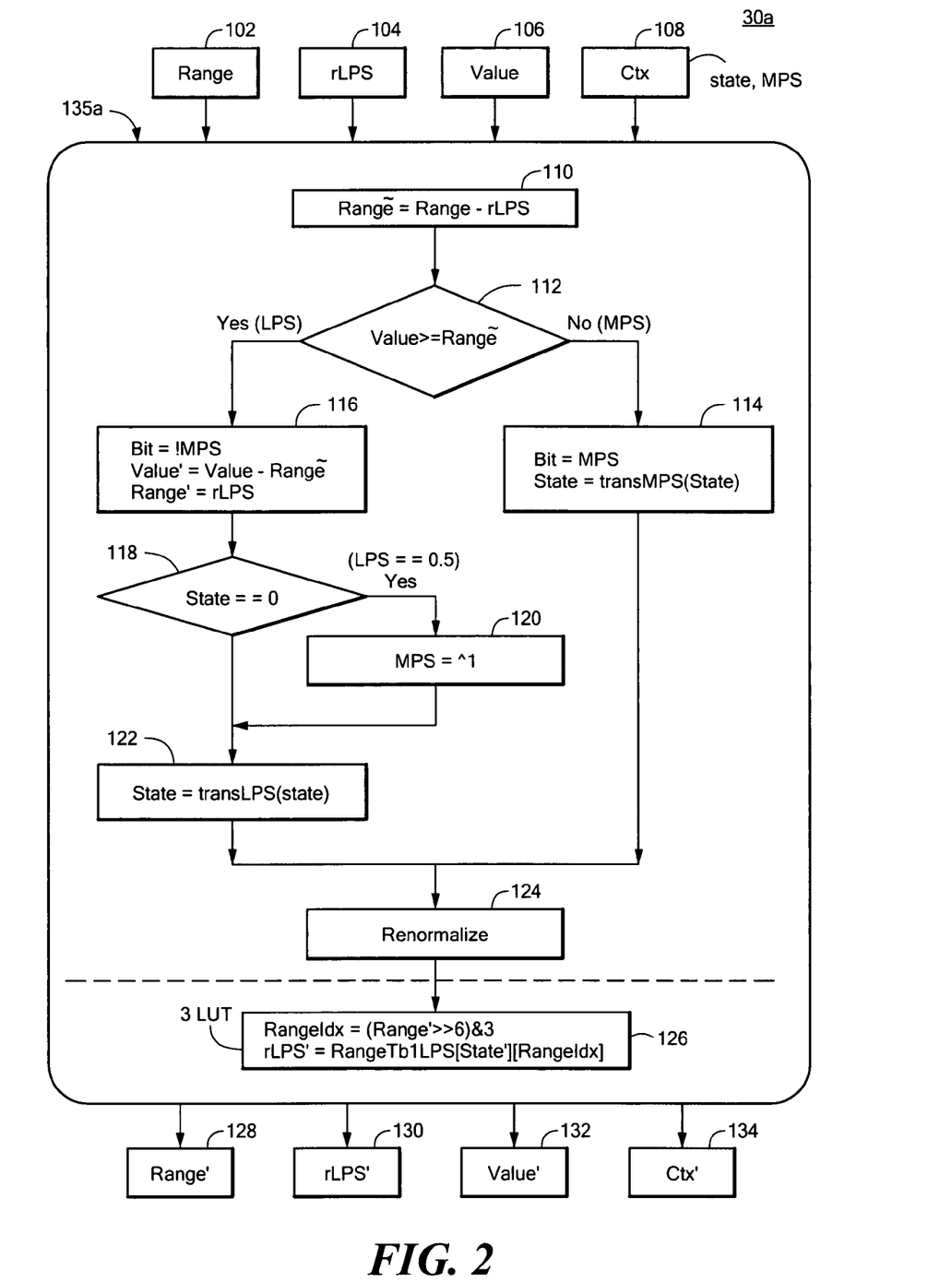
FIG. 2 is a flow block diagram of a method of H.264 CABAC decoding according to this invention.
Figure 3:
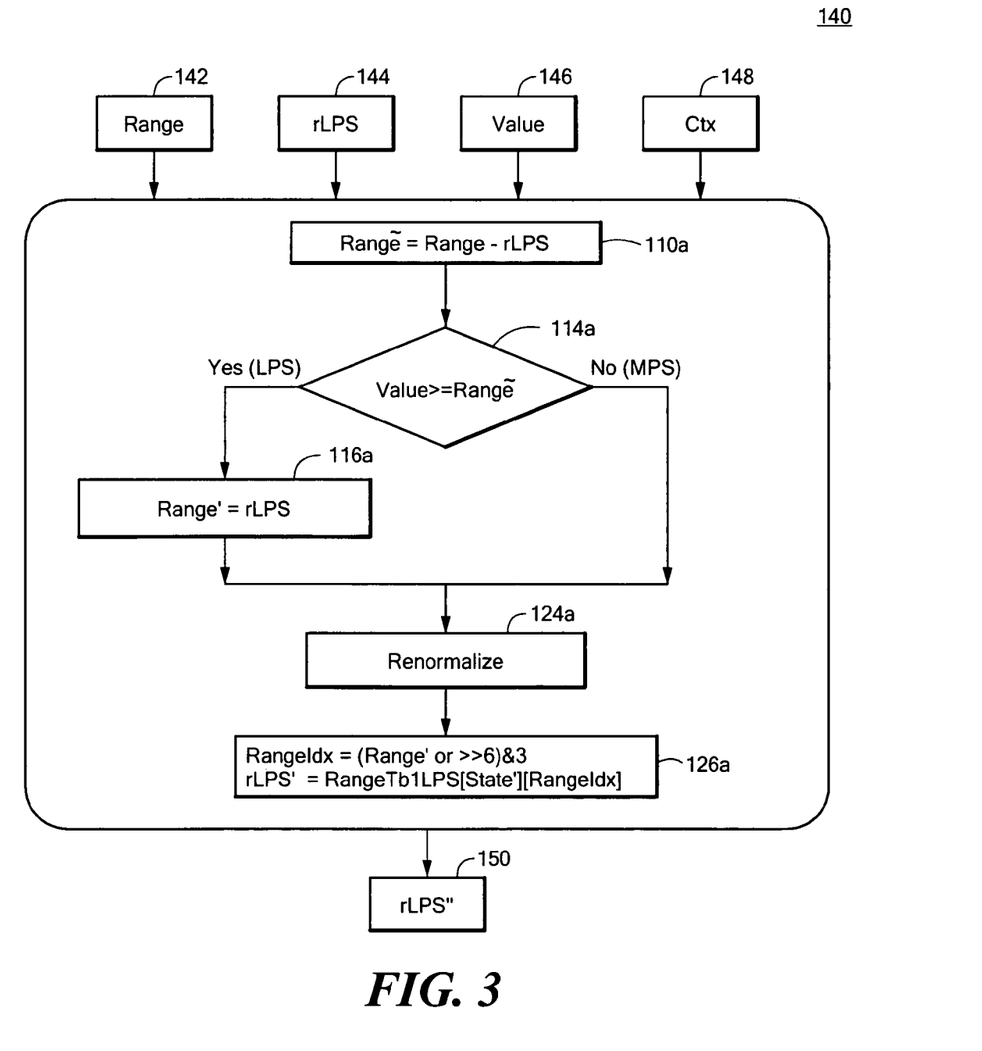
FIG. 3 is a flow block diagram of a parallel process for generating the new context next rLPS concurrently with the next rLPS.

Note that the next rLPS', which is anticipatorily generated according to this invention shown in FIG. 2, is based on a particular context [MPS, State] value 108. As long as this context is going to be used in the next iteration the anticipatory next rLPS, rLPS' being calculated in advance is proper. However, occasionally context itself may change in which case a new context next rLPS' or, rLPS" will have to be created for the new context. This is accommodated by an additional routine or process 140, FIG. 3, which may operate in parallel with the method or process 30a, FIG. 2. In FIG. 3, the present range 142, rLPS 144, value 146, and new context 148, are provided and process 140 generates the new context next rLPS, rLPS" 150 so that even though the rLPS' 130, FIG. 2, generated from the old context 108 is improper the new context next rLPS" 150 will be ready for the preliminary use. Only one of rLPS' and rLPS" will be chosen to be used; the other will be abandoned.

Figure 4A:
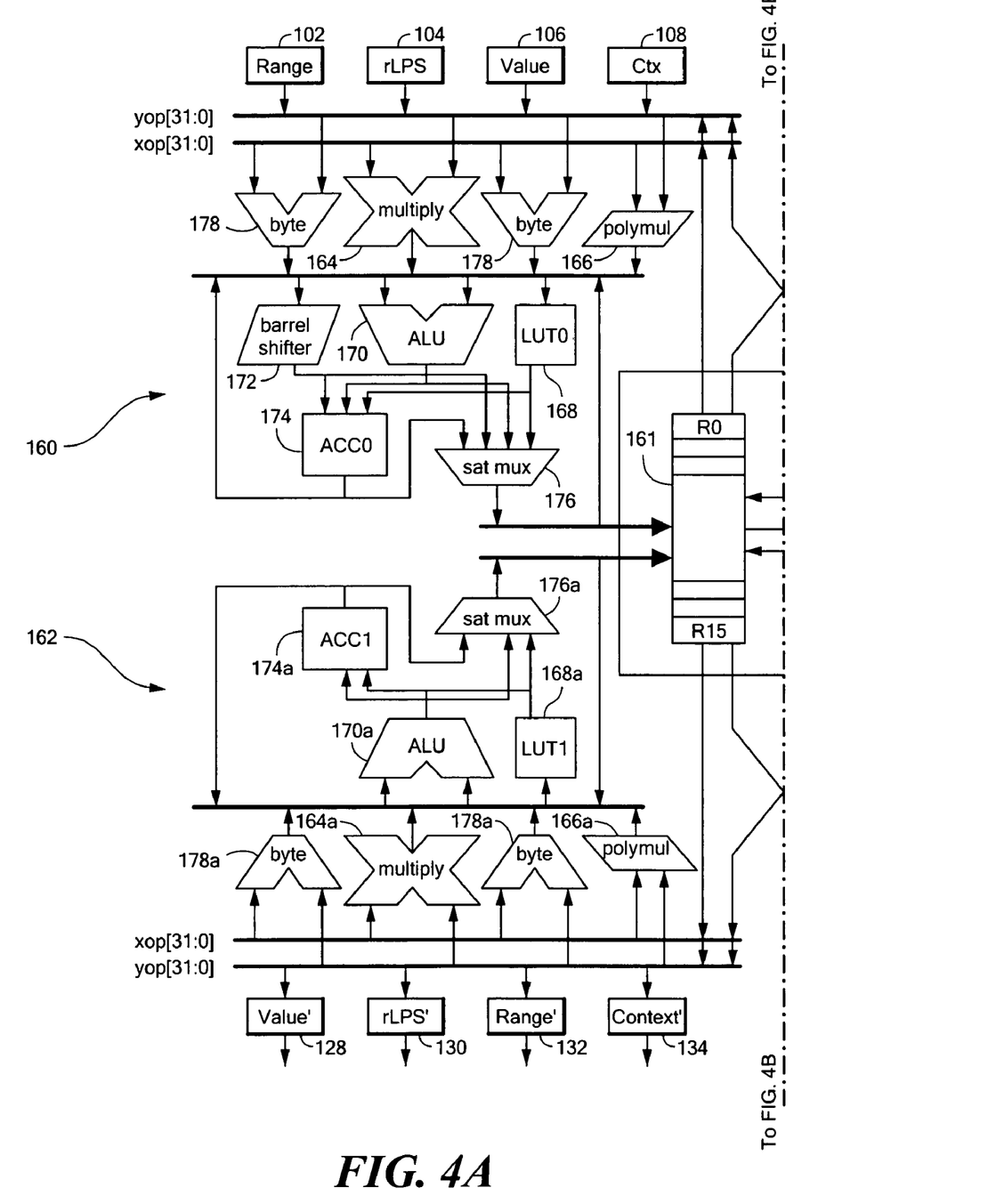
Figure 4B:
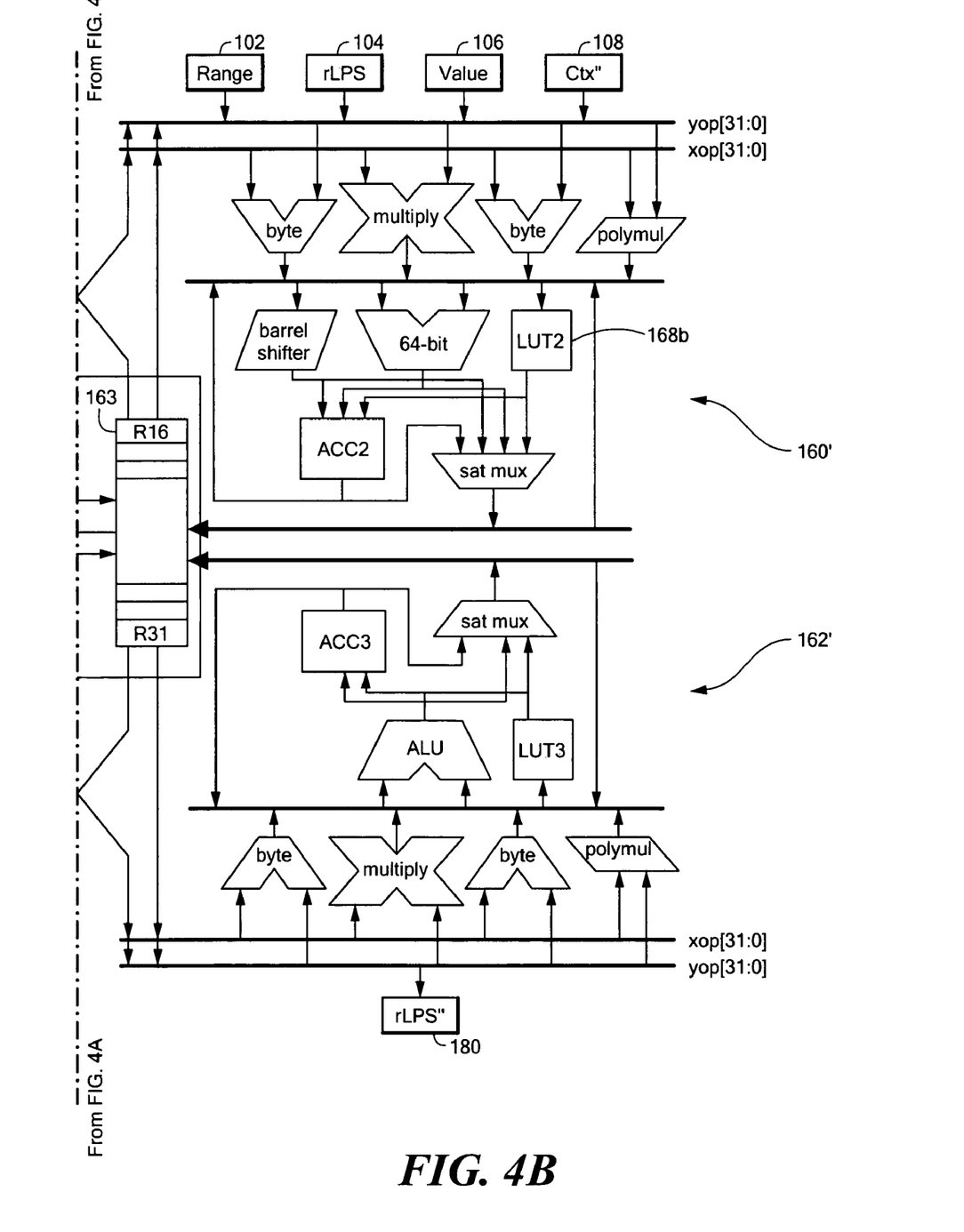

Process 30a, FIG. 2, may be implemented in a pair of compute units 160, 162, FIGS. 4A and 4B, each including a variety of components including e.g., multiplier 164, polynomial multiplier 166, look-up table 168, arithmetic logic unit 170, barrel shifter 172, accumulator 174, mux 176, byte ALUs 178. Compute units 160, 162 perform the method or process 30a of FIG. 2, and look-up tables 168, 168a fill the role of the necessary look-up tables in steps 114, 122, and 126 referred to in FIG. 2. A second set of compute units 160', 162' having the same components can be used operating in parallel on the same inputs range 102, rLPS 104, value 106, and context 108 where the context can be a new context to provide at the output a new context next rLPS, rLPS" 180. Compute units 160, 160' 162, 162' are accessed through register file 161 and 163.

Figures 5, 5A:
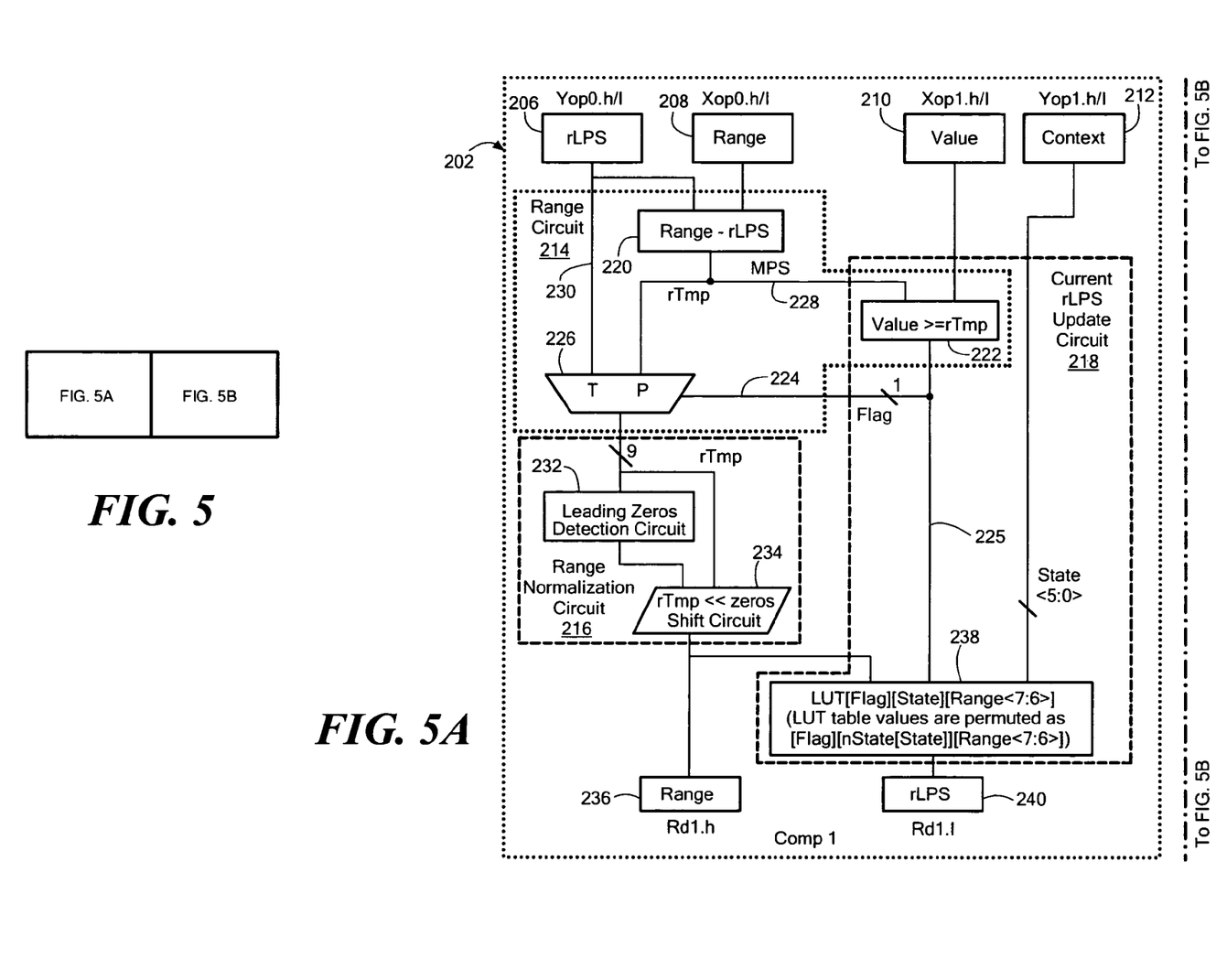
FIG. 5 is a schematic block diagram of first and second compute units in a programmable compute system for executing an H.264 binary decode symbol instruction according to this invention.
Figure 5B:
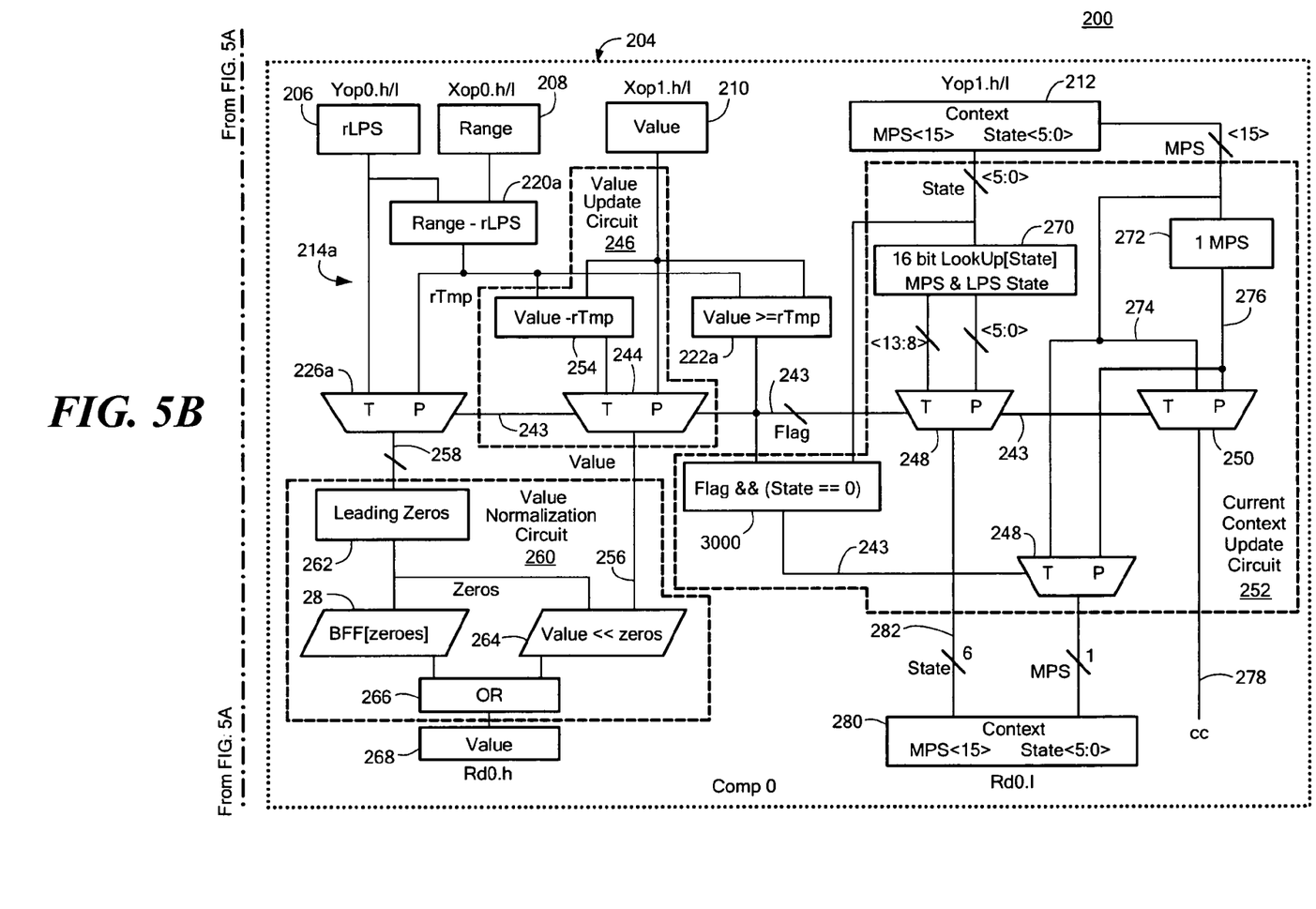

One implementation of the programmable compute system for executing an H.264 binary decode symbol instruction in accordance with this invention 200, FIG. 5, includes a first compute unit 202 and a second compute unit 204. The first compute unit 202 receives four inputs rLPS 206, range 208, value 210, and context 212. It includes a range circuit 214, range normalization circuit 216, and current rLPS update circuit 218. Range circuit 214 includes a subtraction circuit 220, which subtracts the rLPS from the range to provide the un-normalized MPS range or rTmp output. Range circuit 214 also includes a flag signal decision circuit 222 which responds to the current value input 210 and rTmp to determine if the MPS or LPS path should be taken.

Depending upon that comparison as explained previously and in parent case Ser. No. 11/527,001 filed Sep. 26, 2006, a flag signal is provided on line 224 to selection circuit 226 which chooses either the MPS range on line 228 from subtraction circuit 220 or the LPS range 206 on line 230. The selected one of the LPS range and MPS range is then provided to leading zero detection circuit 232 in range normalization circuit 216. Leading zero detection circuit 232 determines the number of leading zeros in the selected range value. Based on the number of leading zeros and the desired normalized range interval [512,256] the range value is shifted or normalized in shifter circuit 234, thereby providing the next range 236. Also included in first compute unit 202 is current rLPS update circuit 218, which contains a permuted look up table 238 that provide the current context next rLPS, rLPS' output 240 according to the next MPS or LPS state of current state which is determined by the flag signal 225 and bits 7, 6 of the next range 236.

The second compute unit 204 receives the same inputs rLPS 206, range 208, value 210, and context 212. It contains a second range circuit 214a which includes subtraction circuit 220a, selection circuit 226a, and detection circuit 222a. Selection circuit 226a, just as its counterpart in the first compute unit, provides the selected one of LPS and MPS range in accordance with the flag signal generated by a decision circuit 222a in the same way as previously. Here the MPS or LSP path selection signal or the flag signal developed by decision circuit 222a is delivered to all of the selector circuits including selector circuit 226a, selector circuit 244 in value update circuit 246 and selector circuits 248 and 250 in current context update circuit 252. Since range circuit 214 and 214a are duplicate circuits and receive the same signals, they produce an identical flag signal. The benefit of the redundancy is that the normal physical restraints on the speed and time and the propagation of the signals are abrogated by the fact that the flag signal in each case is generated locally. The price for this advantage is small since each compute unit includes components which are available to duplicate this function in each compute unit. Value update circuit 246 includes a subtraction circuit 254 which subtracts from the value input 210, the MPS range or rTmp signal from subtractor 220a. Both the input value 210 and the calculated value from subtractor 254 are presented to selector circuit 244 which selects one of those in dependence upon the state of the flag signal. The flag signals on lines 243 in compute unit 204 are identical to those on line 224 in compute unit 202. The selected value on selector 244 output line 256 is known as the selected value value, just as the output on line 258 from selector 226a is known as the selected range value. Compute unit 204 also includes value normalization circuit 260 which includes leading zeros detector circuit 262 which determines the number of leading zeros in the selected range on line 258. Based on the number of leading zeros and the desired normalized range interval [512, 256] the selected value value on line 256 is scaled up or normalized in shifter circuit 264, and the lower new bits of the normalized value value are appended in the OR circuit 266 with the incoming bit stream from the bit stream FIFO 28 to produce the output next value 268.

Current context update circuit 252 in second compute unit 204 includes a sixteen bit 64 entries look up table 270 which typically stores the MPS and LPS state transition tables. Context input 212 includes MPS and state values. The MPS value is delivered to negater circuit 272 and to selector circuit 250. The other input to selector circuit 250 comes from negater circuit 272 so that it receives the MPS signal on line 274 and negated MPS signal on line 276. Again one of these is selected in accordance with the condition of the flag signal on line 243. The output, then, is the actual symbol output on line 278. Look up table 270 provides both the MPS and LPS states to selector circuit 248 and the condition of the flag signal on line 243 determines which of the MPS or LPS state will be selected. That state is delivered to the next context output 280 on line 282 and will be the state for the next context. Similarly the MPS and negated MPS signals on lines 274 and 276, respectively, are delivered to selector circuit 284 which also responds to signal 243 form decision circuit 3000 that identifies if the LPS path was selected and the state equals zero to select one of the two and provide it to the next context output 280 as the next MPS If the context changes, then a new rLPS, rLPS" known as "next rLPS new context" has to be introduced at the inputs of the compute units in place of the current rLPS, rLPS'. The third compute unit 290, FIG. 6, addresses this issue. Third compute unit 290 receives the same inputs and has the same range circuit 214b and range normalization circuit 216b as appears in first and second compute units 202 and 204. It also has next new context rLPS circuit 292 which responds to a new context, appearing at context input 212a, by using the new context state on line 294 to address, in look up table 294, a new rLPS 296 referred to as the next rLPS new context or rLPS" is generated.

Figure 6:
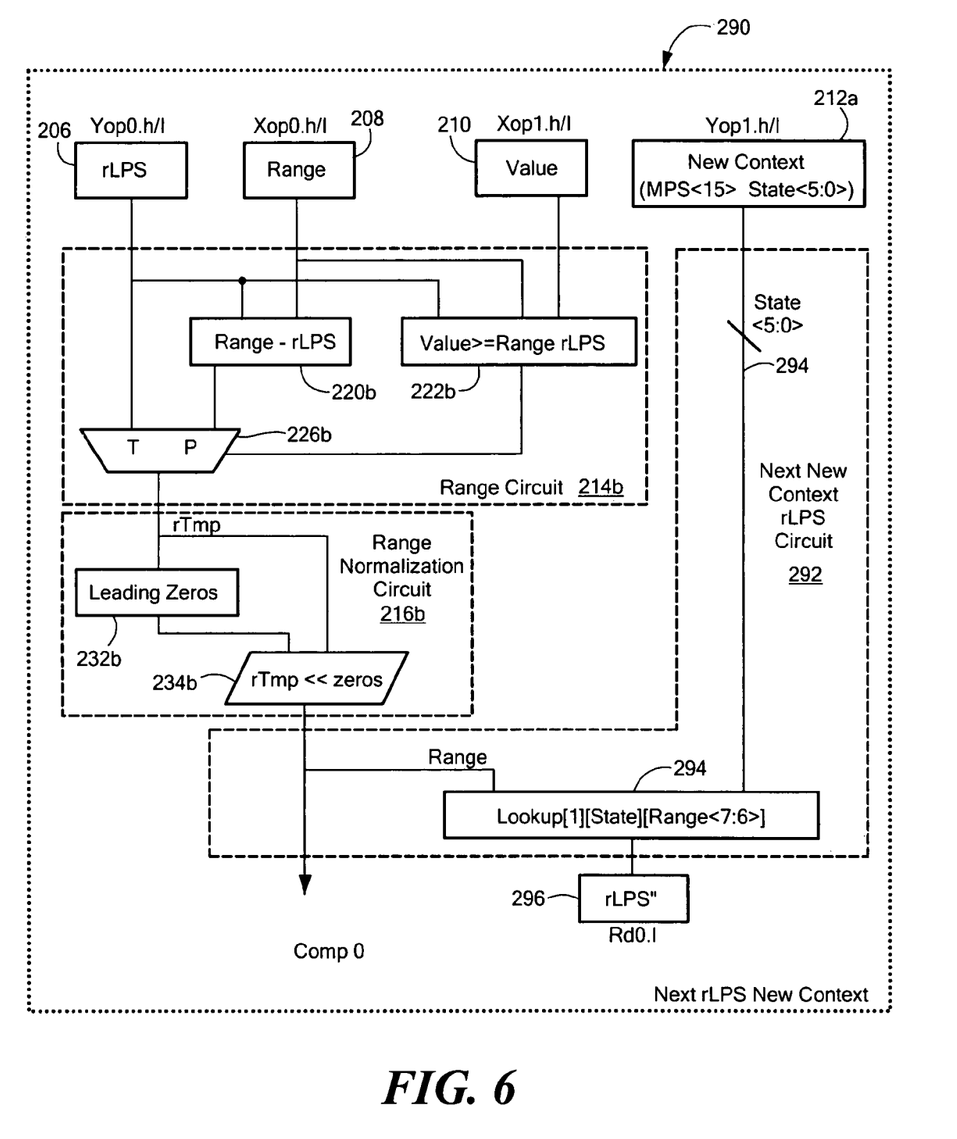
FIG. 6 is a schematic block diagram of third compute unit in the compute system of this invention.
Figure 7A:
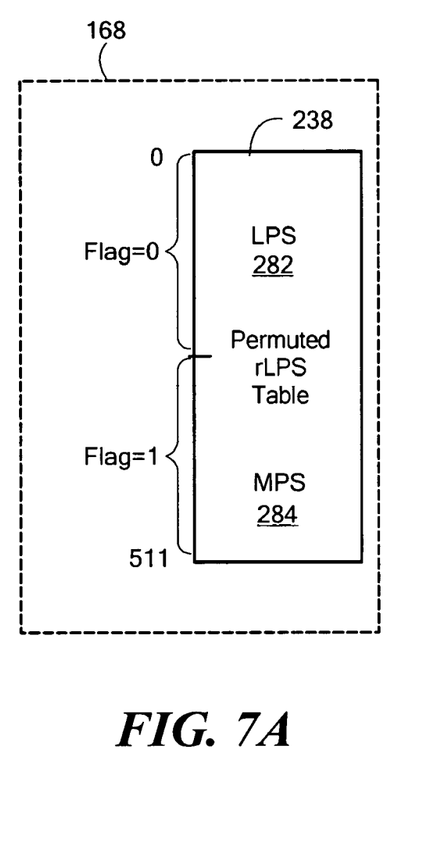
FIG. 7A is a diagrammatic view of a look up table useable in the first compute unit of FIG. 5.
Figure 7B:
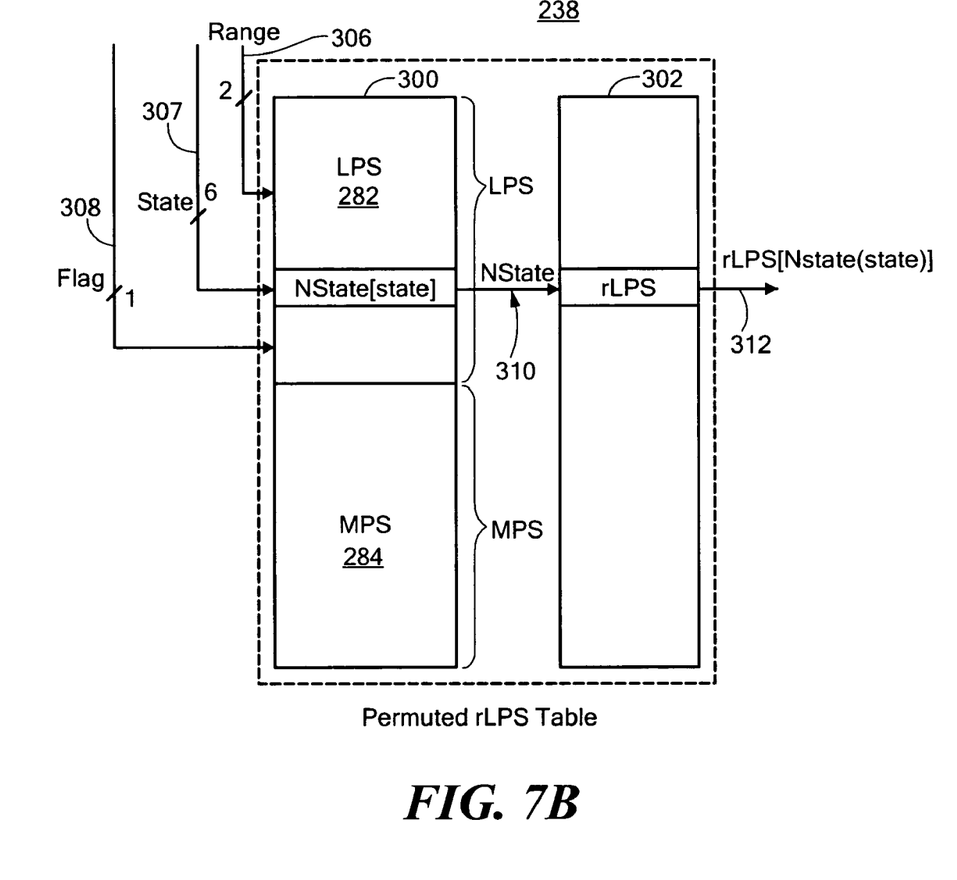
FIG. 7B is a more detailed view of the look up table of FIG. 7A.
Figure 8:
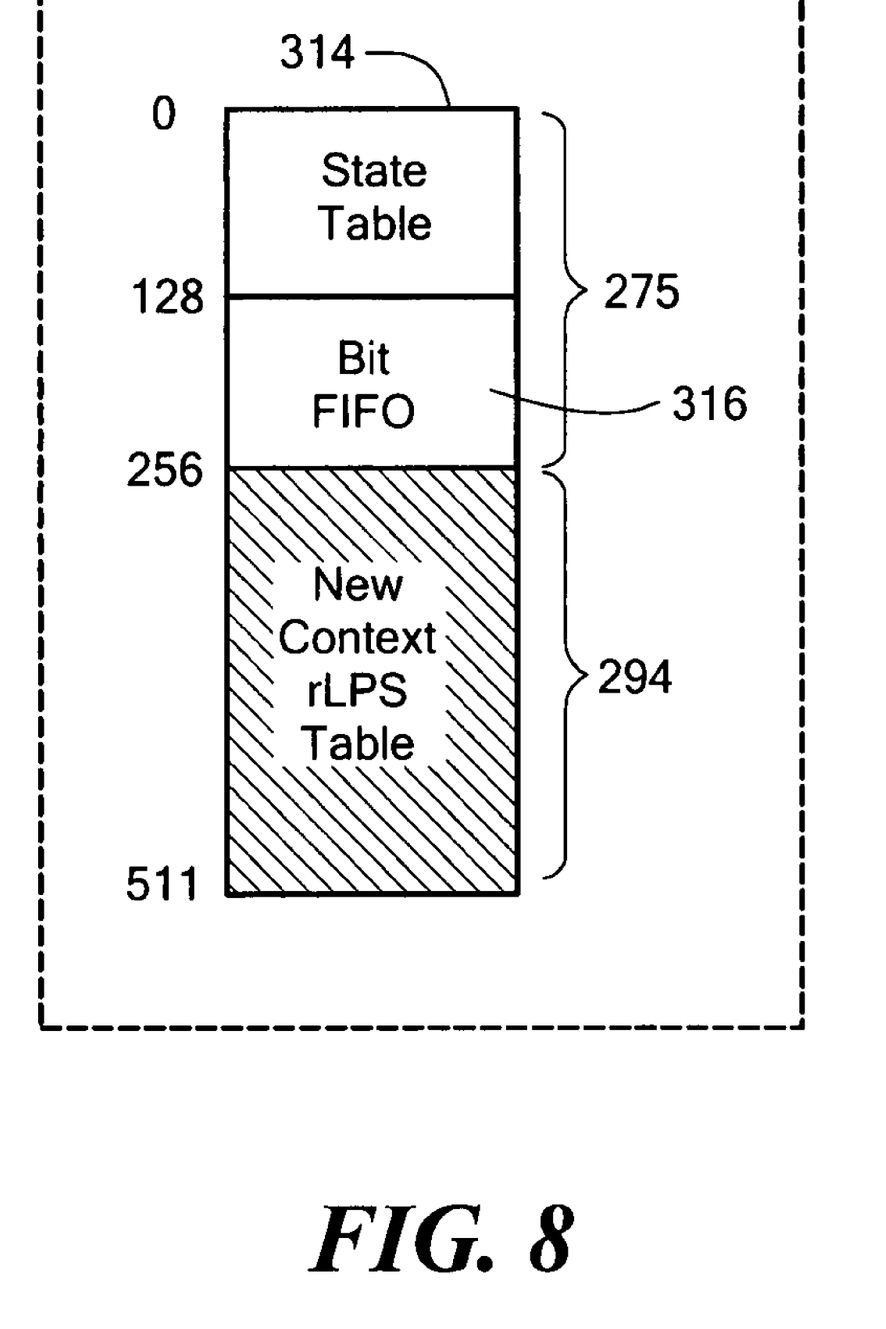
FIG. 8 is a diagrammatic view of a look up table, a portion of which is usable in the second compute unit of FIG. 5 and a portion of which is usable in the third compute unit of FIG. 6 or in a reconfigured version of the first compute unit of FIG. 5 operating in a second mode.

Look up table 238, FIG. 5, is a permuted rLPS table as shown at 238, FIG. 7A. If the flag is at zero the first part of table 238 is addressed for LPS values 282: if the flag is at one, a second part of the table is addressed for MPS values 284. As shown in more detail in FIG. 7B look up table 238 includes a first table, state table 300, and a second table rLPS table 302. Table 300 is addressed by an address composed of the six bit state line 304 and two bit range line 306. The flag line 308 selects the LPS 282 or MPS 284 sections. The current state address table 300 produces the next state output as indicated at 310. The next state output is used to address the rLPS table 302 to provide the next rLPS, rLPS' output at on line 312. Look up table 238 in compute unit 202, FIG. 5, is actually implemented with look up table 168 in FIG. 4A. Look up table 275 in the second compute unit 204 is implemented, FIG. 8, with a combined state table 314 and bit FIFO table 316, where state table 314 stores the 16 bits MPS and LPS states transition tables and bit FIFO table 316 stores the incoming bit stream bits, first in, first out. The look up table 294 in the third compute unit 290, FIG. 6, is implemented, FIG. 8, as a part of the same look up table as the new context rLPS table 294, FIG. 8. The state table 314 and bit FIFO table 316 comprising table 275 and 28 of the second compute unit 204, FIG. 5, may be implemented in look up table 168a, FIG. 4A, while the other portion new context rLPS table 294 may be implemented in look up table 168b of FIG. 4B.

In accordance with this invention it is not necessary to use three compute units to implement this system, only two may do the job. In that case, the second compute unit 204 operates in the first mode, shown as configured using look up table state table 314 and bit FIFO table 316 implemented by look up table 275, implemented by look up table 168a and a first compute unit 202 operates as explained using for its look up table 238, implemented by look up table 168. Then second compute unit 204, in a second mode refers to the new context rLPS table 294 implemented by the second part of look up table 168a and performs all the operations previously explained as being done by the third compute unit but using a new context rLPS. This is easily done, for as can be seen the structure of the first and third compute units is quite similar both having the same inputs and the same outputs. The only difference being in the reconfiguration to implement the new context input using look up table 294.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A programmable compute system for executing an h.264 binary decode symbol instruction comprising:

a first compute unit including a first range circuit responsive to a current range of Least Probable Symbol (rLPS) current range and a current value for calculating Most Probable Symbol (MPS) and Least Probable Symbol (LPS) range values and setting a first flag to select one of them; a range normalization circuit, responsive to the selected one of said MPS and LPS range values to provide normalized range; and a current rLPS circuit including a first look up table responsive to a state, said flag and said normalized range for generating a current context next rLPS;

a second compute unit including a second range circuit responsive to the current rLPS range and value for calculating MPS and LPS range values and setting a second flag to select one of them; a value update circuit, responsive to a current value and a difference between the current range and current rLPS for calculating MPS and LPS value values and responsive to said second flag to select one of them; a value normalization circuit, responsive to said selected range value and a selected value value to provide the next value; and a current context update circuit responsive to current context MPS and state, for determining MPS and LPS state from a second look up table and selecting one of them in response to said second flag and generating an MPS and negated MPS bit and providing a next context MPS and a state and a decode symbol;

a third compute unit including a third range circuit, responsive to current rLPS, range and value for calculating MPS and LPS range values and setting a third flag to select one of them; a second range normalization circuit, responsive to the selected one of said MPS and LPS range values to provide normalized range; and a next new context rLPS circuit, responsive to the new context state and the normalized range to determine from a third look up table the next rLPS for the new context.

2. The programmable compute system for executing an h.264 binary decode symbol instruction of claim 1 in which said first, second and third flags generated in each of first, second and third compute units are identical.

3. The programmable compute system for executing an h.264 binary decode symbol instruction of claim 1 in which each said range circuit includes a subtraction circuit for generating the MPS range from the range and rLPS, a decision circuit for comparing said MPS range and value, and setting said first flag as a function thereof and a selector circuit responsive to said first flag for selecting said MPS range or said LPS range.

4. The programmable compute system for executing an h.264 binary decode symbol instruction of claim 1 in which each range normalization circuit includes a detection circuit for detecting leading zeros in said selected MPS/LPS range value and a shift circuit responsive to leading zeros detected by said detection circuit for shifting up a range to generate a normalized range value.

5. The programmable compute system for executing an h.264 binary decode symbol instruction of claim 1 in which said first look up table responds to a current normalized range and state and said first flag to provide the rLPS values for the next state.

6. The programmable compute system for executing an h.264 binary decode symbol instruction of claim 5 in which said first look up table includes an MPS and an LPS table and said first flag determines which table will be addressed.

7. The programmable compute system for executing an h.264 binary decode symbol instruction of claim 1 in which said value normalization circuit includes a leading zero detection circuit responsive to said selected range value, a shift circuit responsive to a number of leading zeros from said leading zero detection circuit and the selected value value for providing the shifted value value and a bit FIFO for appending the number of leading zeros new bits to said shifted value value to generate said next value.

8. The programmable compute system for executing an h.264 binary decode symbol instruction of claim 1 in which said second look up table includes a state table and a bit FIFO table.

9. The programmable compute system for executing an h.264 binary decode symbol instruction of claim 1 in which said third look up table includes a new context rLPS table.

10. A programmable compute system for executing an h.264 binary decode symbol instruction comprising:

a first compute unit including a first range circuit responsive to the current rLPS current range and current value for calculating Most Probable Symbol (MPS) and LPS range values and setting a first flag to select one of them; a range normalization circuit, responsive to the selected one of said MPS and LPS range values to provide normalized range; and a current rLPS circuit including a first look up table responsive to the state, said flag and said normalized range for generating the current context next rLPS; and a second compute unit including a second range circuit responsive to the current rLPS range and value for calculating MPS and LPS range values and setting a second flag to select one of them; a value update circuit, responsive to a current value and a difference between the current range and current rLPS for calculating MPS and LPS value values and responsive to said second flag to select one of them; a value normalization circuit, responsive to said selected range value and a selected value value to provide the next value; and a current context update circuit responsive to current context MPS and state, for determining MPS and LPS state from a second look up table and selecting one of them in response to said second flag and generating an MPS and negated MPS bit and providing a next context MPS and state and a decode symbol.

11. The programmable compute system for executing an h.264 binary decode symbol instruction of claim 10 in which in a second mode said second compute unit includes a new context rLPS table in said first look up table and is responsive to the current rLPS, range and value and new context for generating the next rLPS for the new context.

12. A programmable compute system for executing an h.264 binary decode symbol instruction comprising:

a first compute unit including a range normalization circuit and an rLPS update circuit, and operating in a first mode responsive to current rLPS, range, value and current context to generate the next normalized range and next rLPS for the current context; a second compute unit including a value update circuit, a context update circuit, and value normalization circuit responsive to current rLPS, range value and current context to obtain an output bit, normalized value and an updated current context; and a third compute unit or said first compute unit operating in a second mode including a range circuit and a next context rLPS circuit responsive to rLPS range, value and next context to obtain a next context rLPS value.

* * * * *